(12) United States Patent  (10) Patent No.: US 7,682,863 B2
Woo (45) Date of Patent: Mar. 23, 2010

(54) CMOS IMAGE SENSOR AND METHOD FOR FABRICATING THE SAME

(75) Inventor: Hyuk Woo, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 106 days.

(21) Appl. No.: 11/869,424

(22) Filed: Oct. 9, 2007

(65) Prior Publication Data

US 2008/0128847 A1 Jun. 5, 2008

(30) Foreign Application Priority Data

Nov. 30, 2006 (KR) .................. 10-2006-0119770

(51) Int. Cl.
*H01L 27/146* (2006.01)
(52) U.S. Cl. .............. 438/74; 438/57; 438/73; 257/440; 257/292; 257/E27.134; 257/E27.135
(58) Field of Classification Search ......... 257/291, 257/292, 440, E27.131, E27.133, E27.134, 257/E27.135; 438/57, 73, 74
See application file for complete search history.

(56) References Cited

U.S. PATENT DOCUMENTS 6,727,521 B2 * 4/2004 Merrill ................... 257/98
2006/0145221 A1 * 7/2006 Lee ....................... 257/294

* cited by examiner

*Primary Examiner*—Matthew C Landau
*Assistant Examiner*—Lindsay Wickers
(74) *Attorney, Agent, or Firm*—Sherr & Vaugh PLLC

(57) ABSTRACT

A Complementary Metal Oxide Semiconductor (CMOS) image sensor includes a red photodiode formed in an first epitaxial layer, an isolation layer formed with a contact region left in a partial area of the red photodiode, a green photodiode formed in a surface of the isolation layer, a contact formed in the contact region at a predetermined spatial distance from the green photodiode, a second epitaxial layer formed on the first epitaxial layer in which the green photodiode is formed, a plurality of plugs formed in the second epitaxial layer and electrically connected to the green photodiode and the contact, a device isolation film formed in a surface of the second epitaxial layer, a blue photodiode formed in a surface of the second epitaxial layer above the green photodiode, and a well region formed in the second epitaxial layer inside the plug.

11 Claims, 4 Drawing Sheets

CMOS IMAGE SENSOR AND METHOD FOR FABRICATING THE SAME

This application claims priority under 35 U.S.C. 119 to Korean Patent Application No. 10-2006-0119770 (filed on Nov. 30, 2006), which is hereby incorporated by reference in its entirety.

BACKGROUND

An image sensor is a semiconductor device for converting an optical image into an electrical signal. Image sensors may be chiefly classified into charge-coupled devices (CCDs) and CMOS Image Sensors (CIS).

A CCD image sensor, however, can be disadvantageous in terms of driving complexity, high power consumption and complexity in fabrication process by requiring numerous masks processing steps.

The CMOS image sensor, on the other hand, has qualities in which the defects of the CCD may not be present. A CMOS image sensor may include a photodiode and a MOS transistor within a unit pixel. The CMOS image sensor sequentially detects an electrical signal of each unit pixel in a switching way to realize an image.

A vertical CMOS image sensor is a type of CMOS image sensor that can be fabricated without using color filter layers. The lack of color filter layers by the vertical CMOS image sensor is accomplished by varying the thickness of a light shielding layer different using a wavelength-dependent absorption degree and varying the transmission depth of light.

Vertical CMOS image sensors offer an advantage such as the lack of a color filter layers or a microlens and realizes all of red (R), green (G), and blue (B) colors through the use of a single pixel.

Figure 1A:
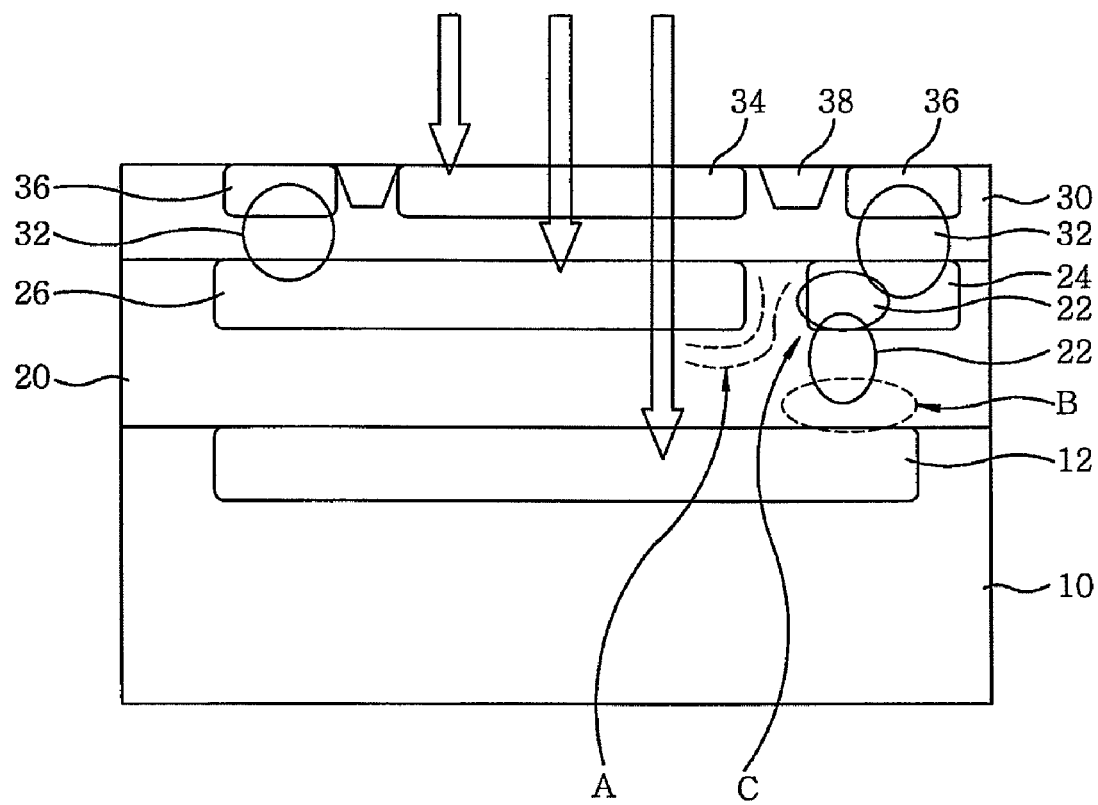

As illustrated in example FIG. 1A, in a vertical CMOS image sensor, ions may be implanted in first epitaxial layer 10 to form red photodiode 12 in first epitaxial layer 10. Second epitaxial layer 20 may then be formed on and/or over first epitaxial layer 10. Ions may then be implanted to form first plug 22 in second epitaxial layer 20. Ions may then be simultaneously implanted in first contact region 24 and also to form green photodiode 26 on and/or over the second epitaxial layer 20. Third epitaxial layer 30 may be formed on and/or over second epitaxial layer 20 and ions may be implanted to form second plug 32 in third epitaxial layer 30.

Device isolation film 38 is formed in third epitaxial layer 30. Ions may then be implanted to form blue photodiode 34 in third epitaxial layer 30, and second contact region 36 can be formed simultaneously formed.

Such vertical CMOS image sensors have several disadvantageous. Firstly, they may experience contact defect (B) at first plug 22. Consequently, contact defect (B) does not allow the flow of an electron-hole pair formed by light collection, thereby causing a noise or inducing a phenomenon of shortage of current.

Secondly, the vertical CMOS image sensor has a curved profile of first plug 22 which results in a curve (A) at a depletion region. Accordingly, green photodiode 26 and first plug 22 should be formed with a large gap therebetween, thereby increasing the size of the CMOS image sensor.

Figure 1B:
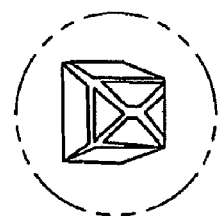

Thirdly, as illustrated in example FIG. 1B, the vertical CMOS image sensor experiences crystal defect (C) in an epitaxial layer growth process due to the epitaxial layer growth process being performed twice.

Finally, the vertical CMOS image sensor requires several additional process steps such as the epitaxial layer growth process, the plug pattern process, the plug ion implantation process.

SUMMARY

In accordance with embodiments a CMOS image sensor is and a method for fabricating the same is provide which enhances yield, requires a simplistic process, and minimizes instances of crystal defect.

Embodiments relate to a CMOS image sensor that may include a red photodiode formed in an first epitaxial layer; an isolation layer formed with a contact region at a partial, upper surface of the red photodiode; a green photodiode formed in a surface of the isolation layer; a contact formed at a distance from the green photodiode in the contact region; a second epitaxial layer formed on and/or over the first epitaxial layer in which the green photodiode is formed; a plurality of plugs formed to connect to the green photodiode and the contact in the second epitaxial layer; a device isolation film formed in a surface of the second epitaxial layer above the plug; a blue photodiode formed in a surface of the second epitaxial layer above the green photodiode; and a well region formed in the second epitaxial layer inside the plug.

Embodiments relate to a method for fabricating a CMOS image sensor that may include at least one of the following steps. Forming a red photodiode in an first epitaxial layer. Forming an isolation layer by ion implantation with a contact region at a partial, upper surface of the red photodiode. Forming a green photodiode in a surface of the isolation layer and a contact in the contact region, respectively, such that they are at a distance from each other. Forming a second epitaxial layer on and/or over the first epitaxial layer in which the green photodiode is formed. Forming a plurality of plugs to connect to the green photodiode and the contact in the second epitaxial layer. Forming a device isolation film in a surface of the second epitaxial layer above the plug. Forming a well region in the second epitaxial layer inside the plug. Forming a blue photodiode in a surface of the second epitaxial layer above the green photodiode.

In accordance with embodiments, advantages may be provided through a CMOS image sensor that does contain any contact defects since no electrical connection to the red photodiode through a plug is required. Moreover, the spatial distance between the green photodiode and a contact can be reduced, thereby providing a microminiature CMOS image sensor. The CMOS image sensor made in accordance with embodiments does not require an epitaxial layer for the green photodiode, thereby preventing crystal defects caused by formation of an epitaxial layer.

DRAWINGS

Example FIGS. 1A and 1B illustrate a CMOS image sensor.

Example FIGS. 2 to 9 illustrate a CMOS image sensor and a method for fabricating a CMOS image sensor in accordance with embodiments.

DESCRIPTION

Figure 2:
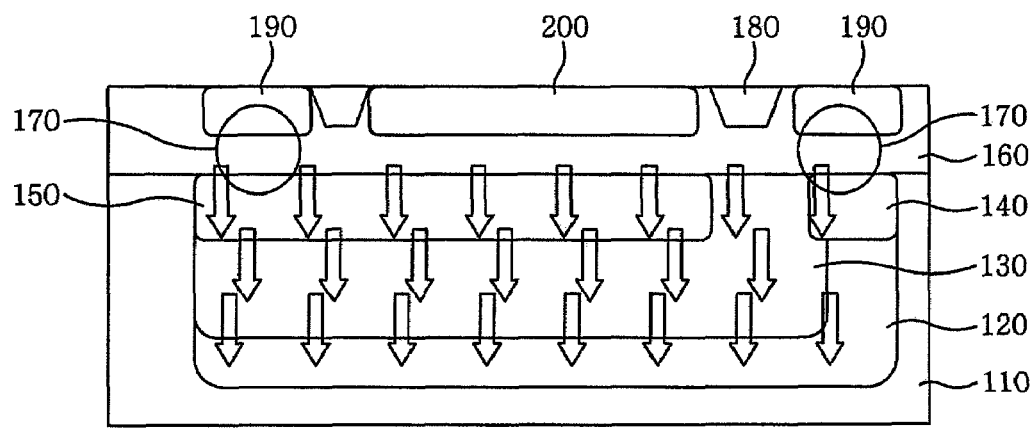

As illustrated in example FIG. 2, a complementary metal oxide semiconductor (CMOS) image sensor may include red photodiode 120 formed in first epitaxial layer 110. Isolation layer 130 can be formed with a contact region at a partial, upper surface of red photodiode 120. Green photodiode 150 can be formed in a surface of isolation layer 130. Contact 140 can be formed a predetermined spatial distance from green photodiode 150 in the contact region. Second epitaxial layer 160 can be formed on and/or over first epitaxial layer 110 in which green photodiode 150 is formed. A plurality of plugs 170 can be formed for electrically connecting to green photodiode 150 and contact 140 in second epitaxial layer 160. Device isolation film 180 can be formed in a surface of second epitaxial layer 160 at an upper surface of plug 170. Blue photodiode 200 can be formed in a surface of second epitaxial layer 160 above green photodiode 150. Well region 190 can then be formed in second epitaxial layer 160 inside plug 170.

Isolation layer 130 can be implanted with conductive-type ions opposite to those of red photodiode 120. Accordingly, isolation layer 130 can insulate red photodiode 120 from green photodiode 150. Isolation layer 130 can be formed by ion implantation with a contact region left at a partial, upper surface of red photodiode 120 in order that isolation layer 130 becomes electrically connected at the contact region with red photodiode 120. Accordingly, the CMOS image sensor made in accordance with embodiments lacks contact defects since it does not require a plug to electrically connect red photodiode 120 in contact 140 region. Moreover, the contact region may have a constant profile, and thus, a depletion region may also have a uniform profile. This arrangement, in turn, may reduce the spatial distance between green photodiode 150 and contact 140 to provide a microminiature CMOS image sensor.

The CMOS image sensor made in accordance with embodiments does not require formation of an epitaxial layer for green photodiode 150 since green photodiode 150 is can be formed in isolation layer 130 of first epitaxial layer 110. This is advantageous for preventing the formation of crystal defects caused by formation of an epitaxial layer.

Figure 3:
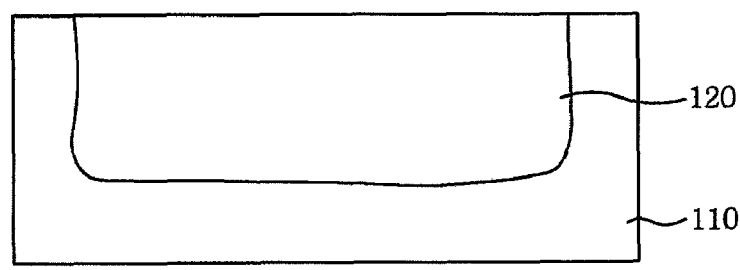

As illustrated in example FIG. 3, a method for fabricating a CMOS image sensor can include implanting N-type ions such as phosphorous (P) and arsenic (As) in first epitaxial layer 110 to form a red photodiode 120.

Figure 4:
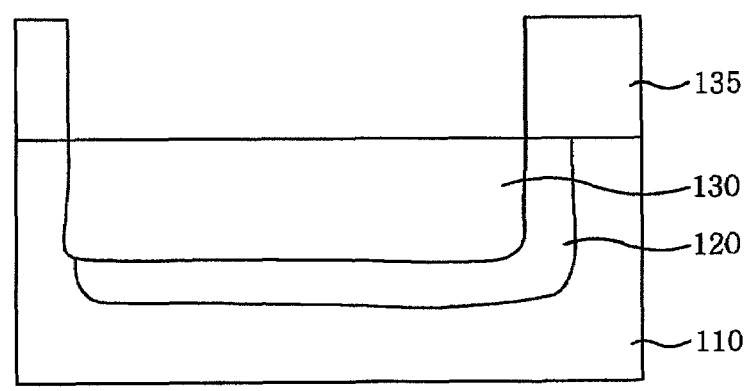

As illustrated in example FIG. 4, ions can be implanted with mask pattern 135 to form isolation layer 130 having a contact region left in a partial area or surface of red photodiode 120. Conductive-type ions opposite to those of red photodiode 120 can be implanted to form isolation layer 130. The conductive-type ions can be implanted such that the contact region is electrically connected with red photodiode 120. The contact region can be provided at a partial, upper surface of red photodiode 120. The conductive-type ions can be composed of P-type ions such as boron (B) which can be implanted in a counter doping process. Accordingly, isolation layer 130 can insulate red photodiode 120 from green photodiode 150 to be formed later.

Figure 5:
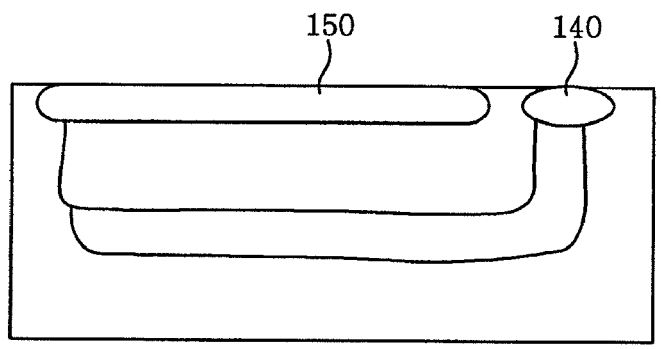

As illustrated in example FIG. 5, contact 140 and green photodiode 150 can be formed at a predetermined spatial distance from each other in the contact region and in a surface of isolation layer 130, respectively. Contact 140 and green photodiode 150 can also be formed simultaneously through N-type ion implantation.

Since the formation of a plug is not required to electrically connect red photodiode 120 in a contact region, the contact region can maintain a constant profile, and thus, a depletion region can also maintains a uniform profile. Consequently, the spatial distance between contact 140 and green photodiode 150 can be reduced, thereby providing a microminiature CMOS image sensor. Moreover, because green photodiode 150 can be formed in isolation layer 130 of first epitaxial layer 110, there is no requirement of forming an epitaxial layer for green photodiode 150. Consequently, crystal defect formation can be prevented.

Figure 6:
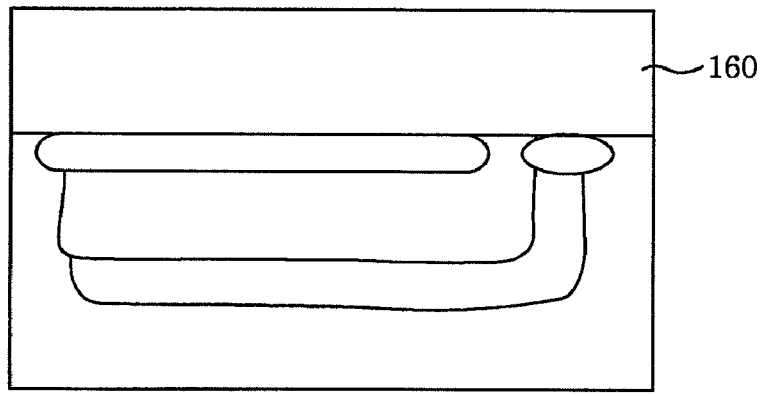

As illustrated in example FIG. 6, second epitaxial layer 160 can be formed on and/or over first epitaxial layer 110 in which the green photodiode 150 is formed.

Figure 7:
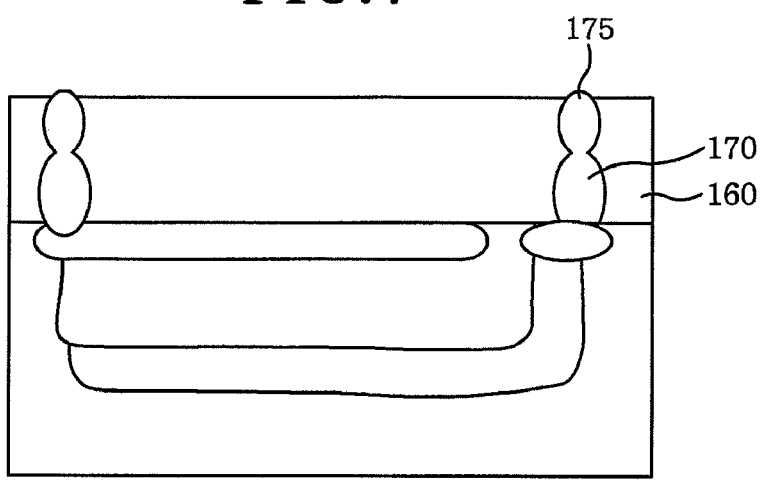

As illustrated in example FIG. 7, a plurality of plugs 170 and 175 can be formed to electrically connect to green photodiode 150 and contact 140 in second epitaxial layer 160.

Figure 8:
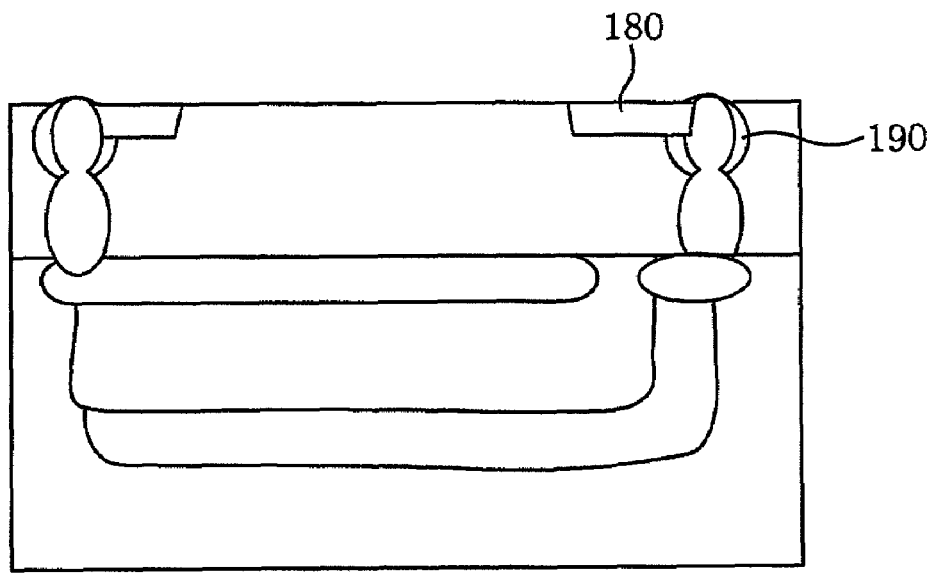

As illustrated in example FIG. 8, device isolation film 180 can be formed in a surface of second epitaxial layer 160 at an upper side of plugs 170 and 175. Well region 190 can be formed in second epitaxial layer 160 inside plugs 170 and 175. Well region 190 can be an N-type well region.

Figure 9:
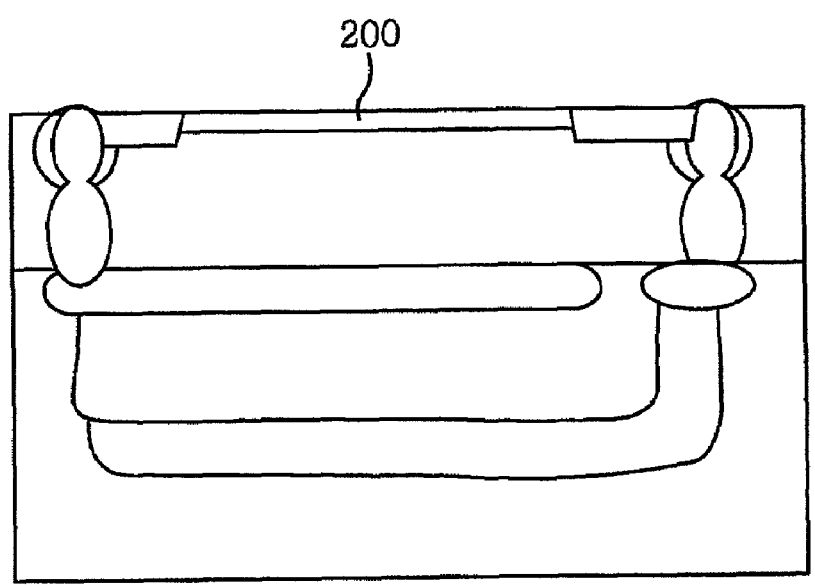

As illustrated in example FIG. 9, N-type ions can be implanted to form blue photodiode 200 in a surface of second epitaxial layer 160 that is spatially set a predetermined distance from well region 190 by device isolation film 180.

The method for fabricating an CMOS image sensor in accordance with embodiments yields advantages such as a simple yet efficient and rapid fabrication process, improved yield by omitting a plug patterning and plug implantation processes to form a red photodiode and an epitaxial layer forming process for forming a green photodiode.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a red photodiode in first epitaxial layer;
    forming an isolation layer in said red photodiode by ion implantation, an upper corner portion of said red photodiode being excluded from the ion implantation and becoming a contact region;
    forming a green photodiode in a surface of said isolation layer;
    forming at least one contact in said contact region a predetermined spatial distance from said green photodiode;
    forming a second epitaxial layer over said first epitaxial layer;
    forming a plurality of plugs in said second epitaxial layer for electrically connecting to said green photodiode and said contact;
    forming a device isolation film in a surface of said second epitaxial layer;
    forming a well region in said second epitaxial layer inside said plurality of plugs; and
    forming a blue photodiode in a surface of said second epitaxial layer above said green photodiode.

2. The method of claim 1, wherein forming said red photodiode comprises implanting N-type ions in said first epitaxial layer.

3. The method of claim 1, wherein said N-type ions comprises at least one of phosphorous and arsenic.

4. The method of claim 1, wherein forming said isolation layer comprises implanting conductive-type ions opposite to ions implanted to form said red photodiode.

5. The method of claim 4, wherein said conductive type ions comprises P-type ions.

6. The method of claim 5, wherein said P-type ions comprises boron.

7. The method of claim 1, wherein forming said at least one contact comprises implanting the same conductive-type ions as ions implanted to form said red photodiode.

8. The method of claim 7, wherein said conductive-type ions are implanted such that said contact region is electrically connected with said red photodiode.

9. The method of claim 1, wherein said isolation layer insulates said red photodiode from the green photodiode.

10. The method of claim 1, wherein said green photodiode and said at least one contact are formed simultaneously.

11. The method of claim 1, wherein said green photodiode and said contact are formed simultaneously using N-type ion implantation.

* * * * *